(12) United States Patent
Mariani et al.

(10) Patent No.: US 6,518,841 B1
(45) Date of Patent: Feb. 11, 2003

(54) ENHANCED FOLDED CASCADE VOLTAGE GAIN CELL

(75) Inventors: Giorgio Mariani, Phoenix, AZ (US); Valter Orlandini, Phoenix, AZ (US)

(73) Assignee: STMicroelectronics Inc., Carrollton, TX (US)

( * ) Notice: Subject to any disclaimer, the term of this patent is extended or adjusted under 35 U.S.C. 154(b) by 0 days.

(21) Appl. No.: 09/929,194

(22) Filed: Aug. 14, 2001

(51) Int. Cl.$^7$ ................................................. H03F 3/45
(52) U.S. Cl. ........................................ 330/253; 330/258
(58) Field of Search ............................... 330/253, 258, 330/257, 261; 327/581

(56) References Cited

U.S. PATENT DOCUMENTS 5,187,680 A * 2/1993 Engeler ........................ 706/37
5,729,178 A * 3/1998 Park et al. .................... 330/253

OTHER PUBLICATIONS

"A 4–Hmz CMOS Continuous–Time Filter with On–Chip Automatic Tuning," Francois Krummenacher and Norbert Joehl, IEEE Journal of Solid–State Circuits, vol. 23, No. 3, Jun. 1988.

"A Large–Signal Very Low–Distortion Transconductor for High–Frequency Continuous–Time Filters," Jose Silva–Martinez, Michel S. J. Steyaert and Willy M.C. Sansen, IEEE Journal of Solid–State Circuits, vol. 26, No. 7, Jul. 1991.

"A 10.7–MHz 68–dB SNR CMOS Continuous–Time Filter with On–Chip Automatic Tuning," Jose Silva–Man Michel S. J. Steyaert and Willy M.C. Sansen, IEEE Journal of Solid–State Circuits, vol. 27, No. 12, Dec. 1992.

* cited by examiner

*Primary Examiner*—Kenneth B. Wells
*Assistant Examiner*—Cassandra Cox
(74) *Attorney, Agent, or Firm*—Lisa K. Jorgenson; William A. Munek

(57) ABSTRACT

A folded cascade voltage gain cell is implemented in a single stage by collapsing p-channel transistor branches receiving output currents from two sets of n-channel transistor branches and producing the output voltage into a single set of branches, summing the output currents from two sets of n-channel transistor branches in a single pair of nodes. While power consumption is only slightly improved over multistage folded cascade voltage gain cells, the circuit is implemented with fewer transistors and is therefore smaller and more reliable. Moreover, because only one gain stage is employed with a smaller number of internal nodes, the circuit's operation contains a smaller number of poles, and bandwidth is improved.

20 Claims, 2 Drawing Sheets

ENHANCED FOLDED CASCADE VOLTAGE GAIN CELL

TECHNICAL FIELD OF THE INVENTION

The present invention is directed, in general, to integrated circuit amplifiers and, more specifically, to voltage gain cells employing a folded cascade topology.

BACKGROUND OF THE INVENTION

Voltage gain cells are typically implemented in two stages, as shown in FIG. 2. The transfer function of the circuit is given by:

$$\frac{V_o}{V_i} = \frac{gm_1}{gm_2} \qquad (1)$$

where $V_i$ is the voltage input to differential amplifier GM1, $V_o$ is the voltage output of differential amplifier GM2, $gm_1$ is the transconductance of differential amplifier GM1, and $gm_2$ is the trasnconductance of differential amplifier GM2.

Some voltage gain cells employ external resistors $R_1$ and $R_2$ as shown in FIG. 3 to set the transconductance value gm of each differential amplifier, where the voltage gain becomes:

$$gm = 1/R. \qquad (2)$$

The voltage gain (i.e., transfer function) for the voltage gain circuit in FIG. 3 is therefore:

$$\frac{V_o}{V_i} = \frac{R_2}{R_1}. \qquad (3)$$

When implemented with a folded-cascade topology, a two stage voltage gain cell of the type shown in FIG. 3 may be implemented by the transistor-level circuit of FIG. 4, where only the essential components are shown and the common mode feedback is not included.

The implementation of a folded cascade voltage gain cell which is shown includes a first stage having n-channel transistors MNU1 and MND1 receiving the input voltage $V_i$ through positive and negative inputs IN+ and IN− at the gates of transistors MNU1 and MND1. Resistors $R_1$ are connected between the sources of transistors MNU1 and MND1, and current sources IU1 and ID1 are each connected between the source of one of transistors MNU1 and MND1 and a ground voltage gnd.

Current source IPUL is connected between the drain of transistor MNU1 (node NU1) and a power supply voltage Vdd. The drain of transistor MND1 is connected to the source of p-channel transistor MPU1 (node ND1), which receives a reference voltage Vref at a common gate connection with p-channel transistor MPD1. The source of transistor MPD1 is connected to node NU1 and, through current source IPU1, to the power supply voltage Vdd. The drains of transistors MPD1 and MPU1 are each connected, through a current source IOD1 and IOU1, respectively, to the ground voltage gnd. The positive and negative output signals OUT+ and OUT− which form the output voltage $V_o$ are drawn from the drains of transistors MPD1 and MPU1, and couple the first and second stages of the voltage gain cell.

Within the second stage, output signals OUT+ and OUT− are connected to the drains of p-channel transistors MPU2 and MPD2, respectively, and to the gates of n-channel transistors MND2 and MNU2, respectively. The drain of transistor MNU2 (node NU2) is connected to the source of transistor MPD2 and to through current source IPU2 to the power supply voltage Vdd. The drain of transistor MND2 (node ND2) is connected to the source of transistor MPU2 and to through current source IPD2 to the power supply voltage Vdd. Resistors $R_2$ are connected between the sources of transistors MNU2 and MND2, and the sources of transistors MNU2 and MND2 and the drains of transistors MPD2 and MPU2 are each connected through one of current sources IU2, ID2, IOD2 and IOU2 to the ground voltage gnd.

Multistage folded cascade voltage gain cells of the type shown in FIG. 4 consume significant power and, because of the number of internal nodes, contain a corresponding number of poles, which limits operational bandwidth. There is, therefore, a need in the art for a folded cascade voltage gain cell having fewer stages and transistors.

SUMMARY OF THE INVENTION

To address the above-discussed deficiencies of the prior art, it is a primary object of the present invention to provide, for use in an integrated circuit, a folded cascade voltage gain cell implemented in a single stage by collapsing p-channel transistor branches receiving output currents from two sets of n-channel transistor branches and producing the output voltage into a single set of branches, summing the output currents from two sets of n-channel transistor branches in a single pair of nodes. While power consumption is only slightly improved over multistage folded cascade voltage gain cells, the circuit is implemented with fewer transistors and is therefore smaller and more reliable. Moreover, because only one gain stage is employed with a smaller number of internal nodes, the circuit's operation contains a smaller number of poles, and bandwidth is improved.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

Figure 1:
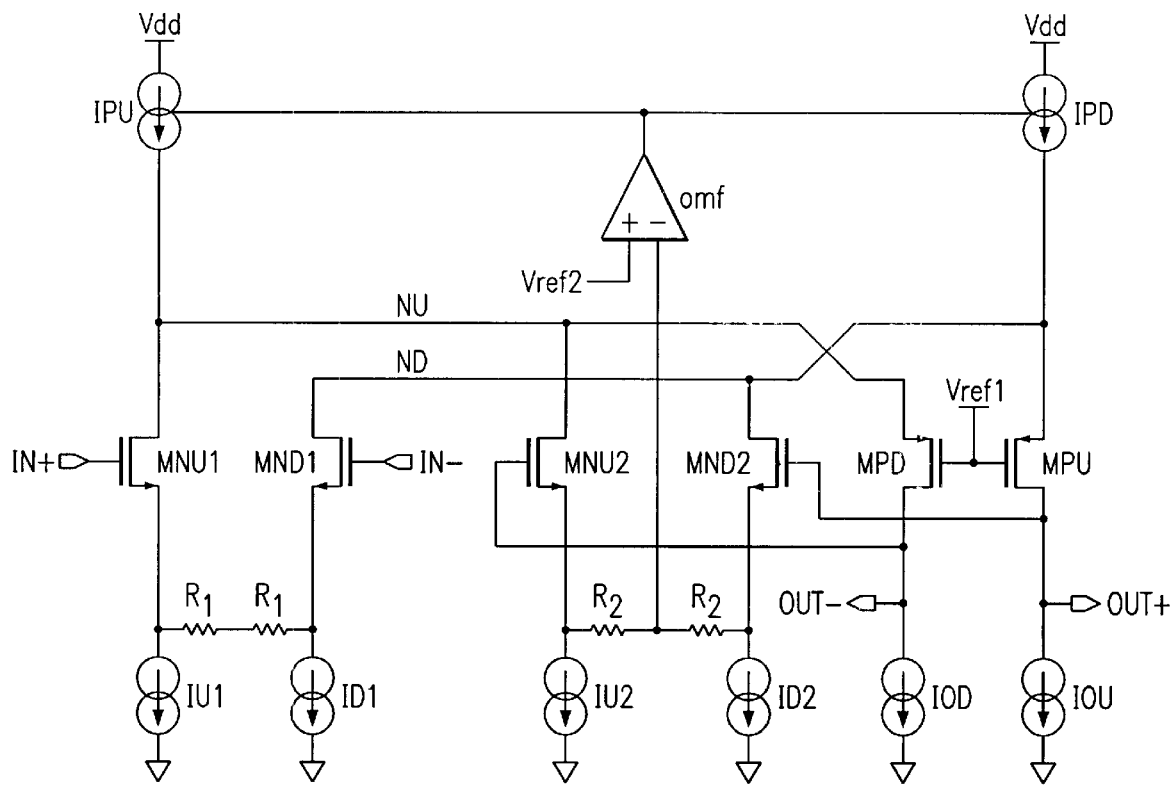
FIG. 1 depicts a folded cascade single stage voltage gain cell according to one embodiment of the present invention.

FIG. 1, discussed below, and the embodiment used to describe the principles of the present invention in this patent document is by way of illustration only and should not be construed in any way to limit the scope of the invention. Those skilled in the art will understand that the principles of the present invention may be implemented in any suitably arranged device.

FIG. 1 depicts a folded cascade single stage voltage gain cell according to one embodiment of the present invention. The input voltage $V_i$ is received differentially through positive and negative inputs IN+ and IN− at the gates of n-channel transistors MNU1 and MND1. Resistors $R_1$ are serially connected between the sources of transistors MNU1 and MND1, and each of the sources of transistors MNU1 and MND1 are connected through one of current sources IU1 or ID1 to the ground voltage gnd. The drain of transistor MNU1 (node NU) is connected through current source IPU to the power supply voltage Vdd, while the drain of transistor MND1 (node ND) is connected through current source IPD to the power supply voltage Vdd. The drain of transistor MNU1 is also connected to the drain of n-channel transistor MNU2 and to the source of p-channel transistor MPD. Similarly, the drain of transistor MND1 is also connected to the drain of n-channel transistor MND2 and to the source of p-channel transistor MPU.

Resistors $R_2$ are serially connected between the sources of transistors MNU2 and MND2, with each source of transistors MNU2 and MND2 being connected through one of current sources IU2 or ID2 to the ground voltage gnd. Transistors MPD and MPU receive the reference voltage Vref1 at a common gate connection. The drains of transistors MPD and MPU are each connected through one of current sources IOD or IOU to the ground voltage gnd.

The positive and negative output signals OUT+ and OUT− which form the output voltage $V_o$ are taken from the drains of transistors MPD and MPU, and are also passed back to the gates of transistors MNU2 and MND2. The common mode feedback from operational amplifier omf to current sources IPU and IPD, based on inputs from the common connection of resistors $R_2$ and the reference voltage Vref2, is also shown in FIG. 1.

Figure 2:
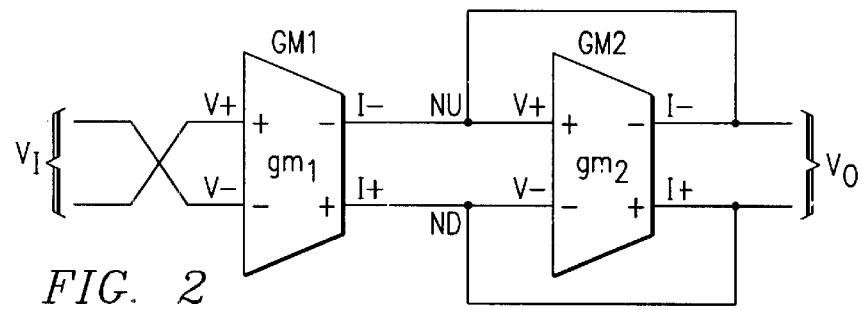
FIG. 2 is a circuit diagram illustrating a multi-stage voltage gain cell.
Figure 3:
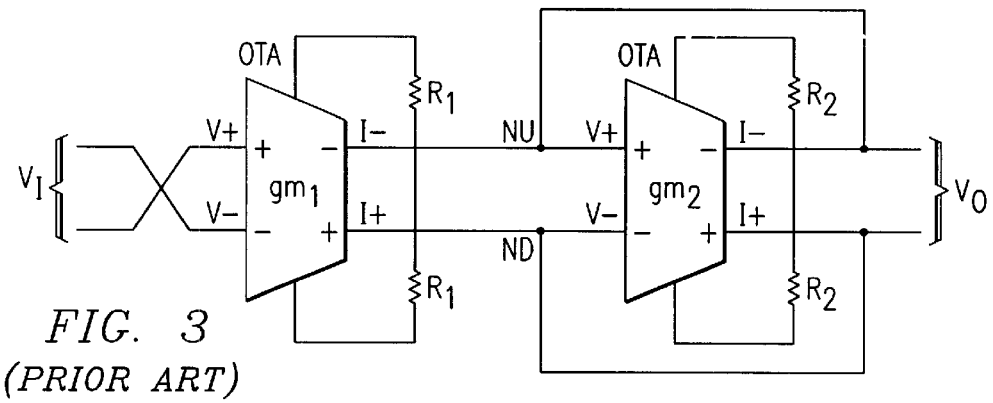
FIG. 3 is a circuit diagram illustrating a variation of the multistage voltage gain cell of FIG. 2.
Figure 4:
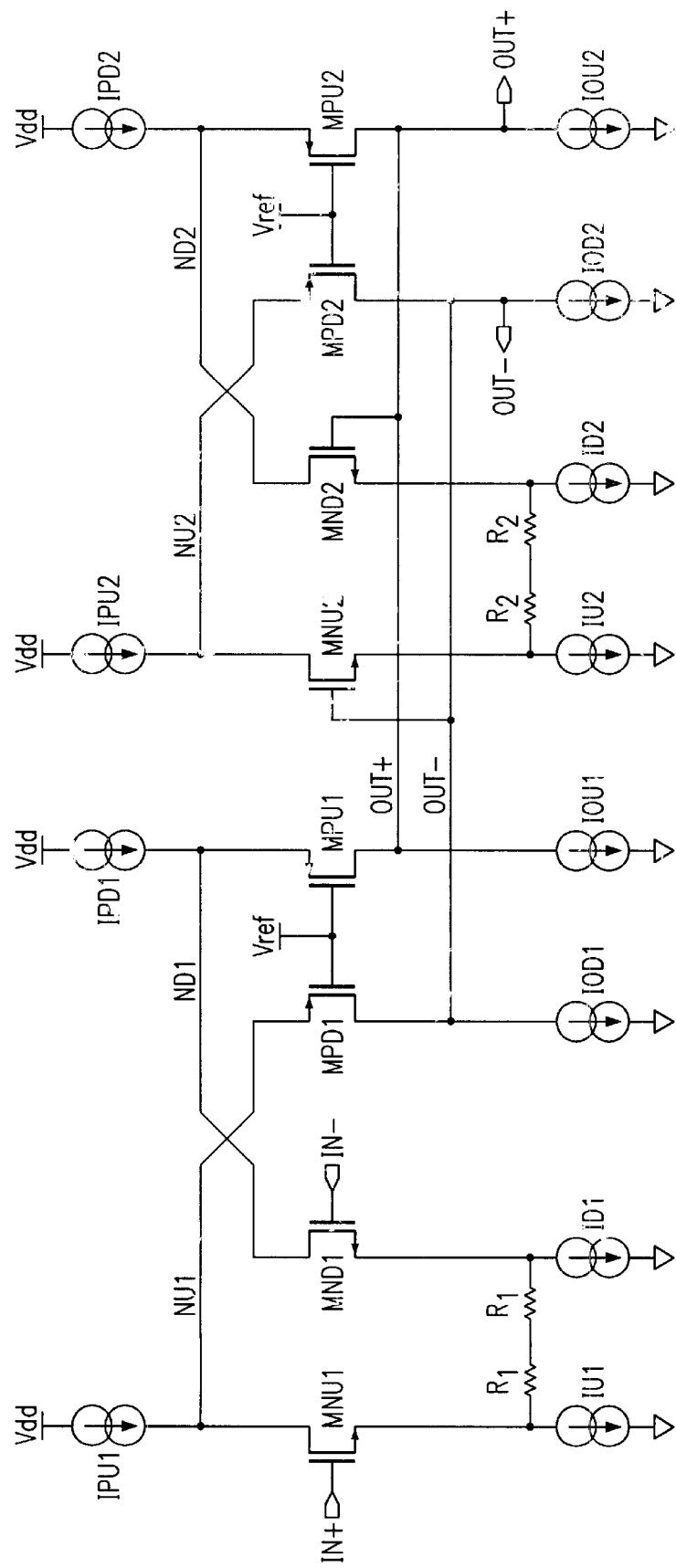
FIG. 4 is a transistor level circuit diagram of a folded cascade implementation of the multistage voltage gain cell of FIG. 3.

The two stages of the circuit in FIGS. 2 and 3 are "compacted" into a single stage in the circuit of FIG. 1. Summing of the output currents of both stages, performed at nodes NU and ND in FIG. 2, is obtained in the circuit of FIG. 1 by identically named nodes NU and ND. The first and second stage branches including p-channel transistors MPD1, MPU1, MPD2 and MPU2 within the circuit in FIG. 3 have been "collapsed" in the circuit of FIG. 1 into a single set of branches containing transistors MPD and MPU.

Power consumption in the circuit of FIG. 1 is only slightly improved over the multistage design of FIGS. 2 and 3 since current in the bias generators (e.g., current sources IPU, IPD, IOD and IOU) is increased. However, because the circuit is implemented with fewer transistors, the voltage gain cell of FIG. 1 is smaller and more reliable. Moreover, because only one gain stage is employed with a smaller number of internal nodes, the circuit's operation contains a smaller number of poles, and bandwidth is improved.

Although the present invention has been described in detail, those skilled in the art will understand that various changes, substitutions, and alterations herein may be made without departing from the spirit and scope of the invention in its broadest form.

What is claimed is:

1. For use in an integrated circuit, a folded cascade voltage gain cell for providing improved reliability and operation comprising:

a first set of branches containing transistors of a first conductivity type, wherein an input voltage for the voltage gain cell is received at gates of the transistors within the first set of branches;

a second set of branches containing transistors of the first conductivity type, wherein an output voltage for the voltage gain cell is received at gates of the transistors within the second set of branches; and a single set of branches containing transistors of a second conductivity type, wherein the single set of branches containing transistors of the second conductivity type receive output currents from the first and second sets of branches and produce the output voltage.

2. The folded cascade voltage gain cell as set forth in claim 1 wherein the single set of branches containing transistors of a second conductivity type further comprises:

two p-channel transistors each coupled at a source thereof to both the first and second branches, wherein output signals at drains of the two p-channel transistors form the output voltage.

3. The folded cascade voltage gain cell as set forth in claim 2 wherein the first set of branches containing transistors of a first conductivity type further comprises:

two n-channel transistors each receiving an input signal at a gate thereof and connected at a drain thereof to a source of one of the two p-channel transistors, wherein the input signals form the input voltage.

4. The folded cascade voltage gain cell as set forth in claim 3 wherein the second set of branches containing transistors of a first conductivity type further comprise:

two n-channel transistors each receiving an output signal at a gate thereof and connected at a drain thereof to a source of one of the two p-channel transistors, wherein the output signals form the output voltage.

5. The folded cascade voltage gain cell as set forth in claim 4 wherein sources of the two n-channel transistors forming the first set of branches are connected by two series connected resistors each having a first resistance and sources of the two n-channel transistors forming the second set of branches are connected by two series connected resistors each having a second resistance, wherein a voltage gain of the folded cascade voltage gain cell equals the second resistance divided by the first resistance.

6. The folded cascade voltage gain cell as set forth in claim 5 wherein drains of each of the n-channel transistors and sources of each of the p-channel transistors are each connected through one of two current sources to the power supply voltage.

7. The folded cascade voltage gain cell as set forth in claim 6 wherein sources of each of the n-channel transistors and drains of each of the p-channel transistors are each connected through a different current source to a ground voltage.

8. A folded cascade voltage gain cell comprising:
a first pair of n-channel transistors each receiving an input signal at a gate thereof, wherein the input signals form a differential input voltage;
a second pair of n-channel transistors each receiving an output signal at a gate thereof, wherein the output signals form a differential output voltage; and
a single pair of p-channel transistors each receiving an output current from both one of the first pair of n-channel transistors and one of the second pair of n-channel transistors at a source thereof, the p-channel transistors producing the output signals at drains thereof.

9. The folded cascade voltage gain cell as set forth in claim 8 wherein the source of an upper signal p-channel transistor is connected to the drain of an upper signal n-channel transistor within the first pair and to a drain of an upper signal transistor within the second pair, and wherein the source of a lower signal p-channel transistor is connected to the drain of a lower signal n-channel transistor within the first pair and to a drain of a lower signal transistor within the second pair.

10. The folded cascade voltage gain cell as set forth in claim 9 wherein sources of the first pair of n-channel transistors are connected by two series connected resistors each having a first resistance and sources of the second pair of n-channel transistors are connected by two series connected resistors each having a second resistance, wherein a voltage gain of the folded cascade voltage gain cell equals the second resistance divided by the first resistance.

11. The folded cascade voltage gain cell as set forth in claim 10 wherein drains of each of the n-channel transistors and sources of each of the p-channel transistors are each connected through one of two current sources to the power supply voltage.

12. The folded cascade voltage gain cell as set forth in claim 11 wherein sources of each of the n-channel transistors and drains of each of the p-channel transistors are each connected through a different current source to a ground voltage.

13. The folded cascade voltage gain cell as set forth in claim 11 wherein each of the two current sources receives common mode feedback.

14. For use in an integrated circuit, a method of amplifying a signal comprising:
receiving an input voltage at gates of transistors within a first set of branches for a folded cascade voltage gain cell, the first set of branches containing transistors of a first conductivity type;

receiving an output voltage at gates of transistors within a second set of branches for the folded cascade voltage gain cell, the second set of branches containing transistors of the first conductivity type; and receiving output currents from both the first and second sets of branches at a third set of branches for the folded cascade voltage gain cell, the third set of branches containing transistors of a second conductivity type and producing the output voltage.

15. The method as set forth in claim 14 wherein the step of receiving output currents from both the first and second sets of branches at a third set of branches for the folded cascade voltage gain cell further comprises:
receiving the output currents at two p-channel transistors each coupled at a source thereof to both the first and second branches, wherein output signals at drains of the two p-channel transistors form the output voltage.

16. The method as set forth in claim 15 wherein the step of receiving an input voltage at gates of transistors within a first set of branches for a folded cascade voltage gain cell further comprises:
receiving the input signals at two n-channel transistors each receiving an input signal at a gate thereof and connected at a drain thereof to a source of one of the two p-channel transistors, wherein the input signals form the input voltage.

17. The method as set forth in claim 16 wherein the step of receiving an output voltage at gates of transistors within a second set of branches for the folded cascade voltage gain cell further comprises:
receiving the output voltage at two n-channel transistors each receiving an output signal at a gate thereof and connected at a drain thereof to a source of one of the two p-channel transistors, wherein the output signals form the output voltage.

18. The method as set forth in claim 17 further comprising:
producing a voltage gain equal to a second resistance $R_2$ for each of two series connected resistors connecting sources of the two n-channel transistors forming the second set of branches divided by a first resistance $R_1$ for each of two series connected resistors connecting sources of the two n-channel transistors forming the first set of branches.

19. The method as set forth in claim 18 further comprising:
receiving a power supply voltage at drains of each of the n-channel transistors and sources of each of the p-channel transistors through one of two current sources.

20. The method as set forth in claim 19 further comprising:
receiving a ground voltage at sources of each of the n-channel transistors and drains of each of the p-channel transistors each through a different current source.

* * * * *